US007026172B2

(12) United States Patent
Lee et al.

(10) Patent No.: US 7,026,172 B2
(45) Date of Patent: Apr. 11, 2006

(54) REDUCED THICKNESS VARIATION IN A MATERIAL LAYER DEPOSITED IN NARROW AND WIDE INTEGRATED CIRCUIT TRENCHES

(75) Inventors: Tai-Peng Lee, Fremont, CA (US); Chuck Jang, Fremont, CA (US)

(73) Assignee: ProMOS Technologies, Inc., Hsin Chu (TW)

( * ) Notice: Subject to any disclaimer, the term of this patent is extended or adjusted under 35 U.S.C. 154(b) by 176 days.

(21) Appl. No.: 10/033,114

(22) Filed: Oct. 22, 2001

(65) Prior Publication Data

US 2003/0077888 A1 Apr. 24, 2003

(51) Int. Cl.
*H01L 21/3065* (2006.01)

(52) U.S. Cl. .......................... 438/9; 438/424; 438/542; 438/700; 438/783; 438/787

(58) Field of Classification Search .................... 438/9, 438/16, 424, 433, 542, 695, 778, 783, 787, 438/788, FOR. 101, FOR. 107, FOR. 114, 438/FOR. 141, FOR. 142, 646, 760, 700, 438/723; 257/646, 760

See application file for complete search history.

(56) References Cited

U.S. PATENT DOCUMENTS

| | | | | |
|---|---|---|---|---|
| 5,728,621 | A * | 3/1998 | Zheng et al. | 438/427 |
| 5,814,564 | A * | 9/1998 | Yao et al. | 438/734 |
| 5,872,058 | A * | 2/1999 | Van Cleemput et al. | 438/692 |
| 5,893,750 | A * | 4/1999 | Hause | 438/633 |
| 6,013,558 | A * | 1/2000 | Harvey et al. | 438/424 |
| 6,030,881 | A * | 2/2000 | Papasouliotis et al. | 438/424 |
| 6,060,132 | A * | 5/2000 | Lee | 427/579 |
| 6,159,822 | A * | 12/2000 | Yang et al. | 438/427 |
| 6,211,040 | B1 * | 4/2001 | Liu et al. | 438/424 |
| 6,218,266 | B1 * | 4/2001 | Sato et al. | 438/427 |
| 6,271,119 | B1 * | 8/2001 | Kishimoto | 438/624 |
| 6,291,030 | B1 * | 9/2001 | Chao et al. | 427/579 |
| 6,337,255 | B1 * | 1/2002 | Bradl et al. | 438/424 |
| 6,368,988 | B1 * | 4/2002 | Li et al. | 438/792 |
| 6,413,886 | B1 * | 7/2002 | Kersch et al. | 438/788 |
| 6,468,921 | B1 * | 10/2002 | Shih et al. | 438/758 |
| 6,500,771 | B1 * | 12/2002 | Vassiliev et al. | 438/783 |
| 6,559,026 | B1 * | 5/2003 | Rossman et al. | 438/424 |
| 6,583,069 | B1 * | 6/2003 | Vassiliev et al. | 438/778 |
| 6,617,224 | B1 * | 9/2003 | Yu et al. | 438/435 |
| 6,733,955 | B1 * | 5/2004 | Geiger et al. | 430/313 |

OTHER PUBLICATIONS

S.V. Nguyen, "High Density Plasma Chemical Vapor Deposition of Silicon-based Dielectric Films For Integrated Circuits" (visited Jul. 26, 2001) <http://www.research.ibm-.com/journal/rd/431/nguyen.html>.

* cited by examiner

*Primary Examiner*—George Fourson
*Assistant Examiner*—Joannie Adelle Garcia
(74) *Attorney, Agent, or Firm*—MacPherson Kwok Chen & Heid LLP; Gideon Gimlan

(57) ABSTRACT

A high density plasma chemical vapor deposition (HDP-CVD) process is used to deposit silicon dioxide in trenches of various widths. The thickness of the silicon dioxide filling both narrow and wide trenches is made more uniform by reducing an HDP-CVD etch to deposition ratio. The lowered etch to deposition ratio is achieved by lowering a ratio of oxygen to silane gas, by lowering the power of a high frequency bias signal, and by lowering the total gas flow rate.

53 Claims, 2 Drawing Sheets

REDUCED THICKNESS VARIATION IN A MATERIAL LAYER DEPOSITED IN NARROW AND WIDE INTEGRATED CIRCUIT TRENCHES

BACKGROUND

1. Field of invention

Depositing material in trenches formed in integrated circuit substrates, and in particular reducing the thickness variations of a silicon dioxide layer deposited in narrow and wide substrate trenches using a high density plasma chemical vapor deposition process.

2. Related art

In a typical integrated circuit, electrically active areas are formed in a semiconductor substrate. The active areas are separated by electrical insulation regions. One method of forming such insulation regions is shallow trench isolation (STI).

In a typical STI process, a silicon nitride layer is deposited over a monocrystalline silicon substrate. One or more other layers (e.g., polycrystalline silicon) may exist between the silicon nitride and the substrate. The silicon nitride layer is patterned to cover the active areas, but not the areas in which the insulation regions are to be formed. Trenches are etched in the substrate (and in overlying layers, if any) at insulation region locations. Then, an insulating layer of silicon dioxide ($SiO_2$) is deposited. The silicon dioxide covers the silicon nitride and fills the trenches. Next, chemical-mechanical polishing (CMP) is used to remove the deposited silicon dioxide overlying the silicon nitride. The CMP stops at the silicon nitride, and the trenches remain filled with silicon dioxide. Finally, an etch (e.g., wet anisotropic etch using hydrofluoric acid) is performed.

A High Density Plasma Chemical Vapor Deposition (HDP-CVD) process is used to deposit the $SiO_2$ in the trenches. The HDP-CVD process differs from Plasma Enhanced Chemical Vapor Deposition (PECVD) and low pressure Chemical Vapor Deposition (CVD). In HDP-CVD, the ion flux to the substrate surface on which material is deposited is larger than the net deposition flux to the surface. As a result, the deposited $SiO_2$ film is more dense and has less hydrogen incorporation as compared to an $SiO_2$ film deposited using PECVD. In addition, the HDP-CVD ion flux assists sputtering and oxide etch at the upper trench corners. A low pressure Chemical Vapor Deposition (CVD) process must be done in a furnace at high temperatures (typically above 700° C.) to thermally deposit $SiO_2$ on the substrate. In contrast, HDP-CVD requires plasma to break down the gas species so that their components will form $SiO_2$ on the substrate surface.

Isolation trenches may be characterized by an aspect ratio, which is the ratio of trench depth to trench width (depth divided by width). HDP-CVD is used for sub-micron ultra large scale integration (ULSI) technologies due to its high aspect ratio (more than 4:1) trench fill capability as compared with, for example, a low pressure CVD process.

A SPEED model tool, manufactured by NOVELLUS, Inc. of San Jose, Calif., can be used to deposit silicon dioxide in an HDP-CVD STI process. The substrate on which the silicon dioxide is to be deposited is placed in the tool's reaction chamber. A mixture of silane ($SiH_4$), oxygen ($O_2$), and inert (e.g., argon (Ar) or helium (He)) gasses is introduced into the reaction chamber. The silane and oxygen react to form silicon dioxide and hydrogen.

When a plasma (glow discharge) is formed in the reaction chamber, the HDP-CVD process deposits material. In many instances the HDP-CVD process also sputter etches at least a part of the deposited material. A low frequency (e.g., 400 kilohertz (kHz)) radio frequency (RF) signal is established between an electrode and the substrate and creates the plasma ions. In addition, a high frequency (HF) (e.g., 13.56 MegaHertz (MHz)) bias signal is established between the electrode and the substrate. The HF bias signal attracts positive ions (e.g., $He^+$ ions) used to resputter oxide deposited at the top corners (cusps) of the trenches, and the resputtered oxide helps to fill the trench. The ion current results in a DC potential between the electrode (anode) and the substrate (cathode).

For trenches of equal depth, a wide trench's volume to be filled with oxide is larger than a narrow trench's volume to be filled. The amount of oxide etched from the top corners of the wide and narrow trenches is not proportional to the volumes to be filled. Therefore, relatively more etched oxide helps to fill the narrow trench than helps to fill the wide trench. As a result, when an HDP-CVD process ends, the oxide layer filling and overlying the narrow trench is thicker than the oxide layer filling and overlying the wide trench. During subsequent CMP, more oxide is removed over the wide trench than is removed over the narrow trench due to CMP overpolishing ("dishing"). The following hydrofluoric acid anisotropic etch does not promote uniform $SiO_2$ thickness among the narrow and wide trenches. Accordingly, after HDP-CVD, CMP, and subsequent wet etch, the oxide thickness filling narrow and wide trenches is non-uniform. However, the $SiO_2$ often serves as a base for subsequently deposited overlying layers. Since such overlying layers should be planar and have uniform thickness, it is desirable to deposit silicon dioxide such that the oxide thickness filling and overlying trenches of various aspect ratios on the same wafer is relatively uniform.

SUMMARY

HDP-CVD is used to deposit silicon dioxide over a semiconductor wafer in which trenches are formed. Oxygen and silane gasses react to form the deposited silicon dioxide. A high frequency bias signal is used to make plasma ions etch a portion of the deposited silicon dioxide at the top corners (cusps) of the trenches. The etching and the depositing of the silicon dioxide is controlled such that the etch to deposition ratio is 0.07 or less. In some embodiments this etch to deposition ratio is achieved by using an oxygen to silane ratio of 1.3 or less. Low etch to deposition ratio is also achieved by reducing the high frequency bias power used to etch the deposited silicon dioxide, and by reducing the total gas flow rate.

DETAILED DESCRIPTION

Persons familiar with integrated circuit fabrication will understand that the drawings are not to scale, and that certain well-known features (e.g., specific layer fill shapes) have been omitted from the drawings so as to more clearly illustrate the invention. Embodiments were carried out using a SPEED tool manufactured by NOVELLUS, INC. of San Jose, Calif. Cross-sectional thickness measurements were measured on patterned semiconductor wafers by using a HITACHI model 5400 scanning electron microscope. Non-destructive thickness and thickness uniformity measurements were determined using an OPTIPROBE 2600 manufactured by THERMAWAVE of Fremont, Calif. Other tools may be used in accordance with the invention.

Figure 1:
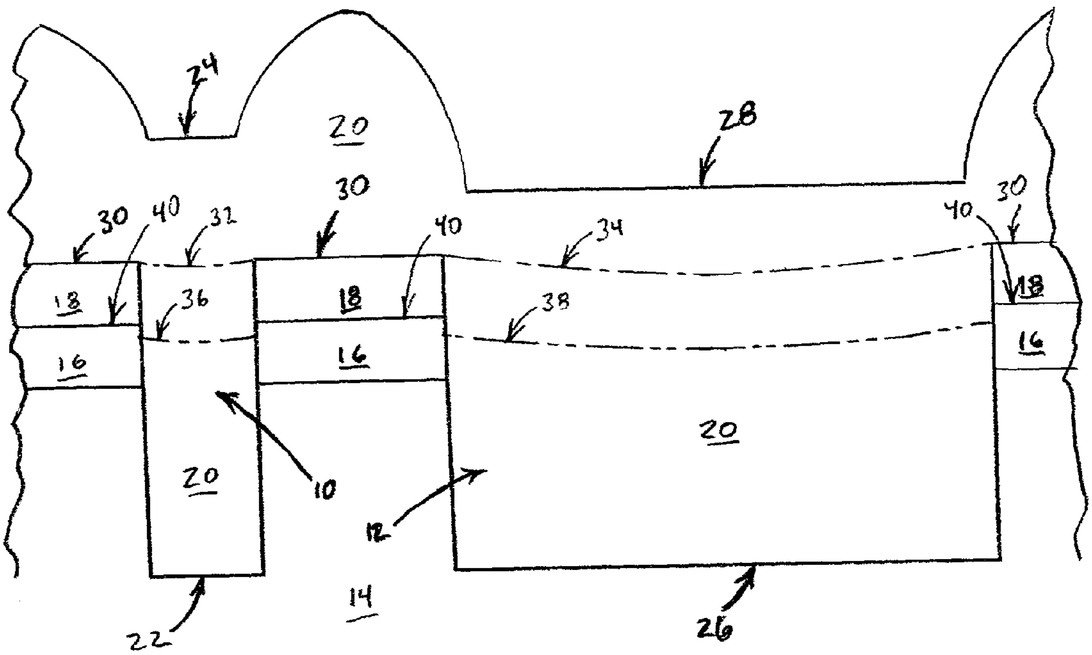
FIG. 1 is a cross-sectional view of an integrated circuit structure.

FIG. 1 is a cross-sectional view illustrating a typical thickness variation in an HDP-CVD deposited layer. Narrow trench 10 and wide trench 12 are formed in integrated circuit substrate 14 (e.g., wafer of monocrystalline silicon). Narrow trench 10 has an aspect ratio of at least 2.5 (e.g. 5000 Å deep/1800 Å wide) and wide trench 12 has an aspect ratio of less than 1.0 (e.g., 5000 Å deep/8800 Å wide). Layer 16 (e.g., polycrystalline silicon) and layer 18 (e.g., silicon nitride) are shown in FIG. 1 to illustrate that one or more layers may be formed over substrate 14, and that trenches 10,12 may extend through such layers. Active electronic devices such as transistors may be formed in substrate 14 or in layers overlying substrate 14. Metal layers patterned to form electrically conductive interconnects may also be formed over substrate 14.

Layer 20 (e.g., silicon dioxide) is formed over substrate 14 using an HDP-CVD process so as to fill the trenches 10,12. Layer 20 is illustrative of layers formed using an HDP-CVD process in accordance with the invention. Such layers may be formed directly on the substrate, or overlying other layers such as polycrystalline silicon, silicon nitride, or metal formed over the substrate. In some embodiments layer 20 is doped using conventional P-type or N-type dopants. In other embodiments, layer 20 is not doped.

As shown in FIG. 1, the thickness of layer 20 overlying and filling trench 10 is defined between bottom surface 22 of trench 10 and top surface 24 of layer 20. Similarly, the thickness of layer 20 overlying and filling trench 12 is defined between bottom surface 26 of trench 12 and top surface 28 of layer 20. FIG. 1 illustrates (in exaggerated scale) that the HDP-CVD process makes the thickness of layer 20 overlying and filling trench 10 larger than the thickness of layer 20 overlying and filling trench 12.

Since HDP-CVD both etches and deposits material, an etch to deposition (E/D) ratio is established for particular process parameters. The E/D ratio is the amount of material etched divided by the amount of material deposited. In one instance, the etch to deposition ratio is determined by using an HDP-CVD process to deposit $SiO_2$ on an unpatterned wafer for a particular time. The thickness of the deposited oxide layer is determined. Then, on another unpatterned wafer, the same HDP-CVD process parameters are used to deposit $SiO_2$, but the high frequency bias signal is turned off. The thickness of this second oxide layer is determined. The difference in the oxide layer thicknesses of the two wafers is the amount etched for a particular set of process parameters. The E/D ratio is determined by dividing the amount etched by the amount deposited under non-bias conditions. Etching due to HF bias was verified by using HF bias only on oxide wafers in the reaction chamber. After HF bias only conditions, the measured oxide thickness was less than the original thickness.

The inventors have discovered that thickness variations in an HDP-CVD deposited silicon dioxide layer filling both narrow (e.g., 1800–3300 Å) and wide (e.g., 6600–8800 Å) trenches of the same depth (e.g., 5000 Å) are controlled by minimizing the E/D ratio. The wide trenches are at least twice the width of the narrow trenches, so that the aspect ratio of the wide trenches is less than half the aspect ratio of the narrow trenches. Three process parameters in the HDP-CVD reaction chamber are used to control the E/D ratio: the ratio of oxygen to silane gas, the power of the high frequency bias signal, and the total gas flow rate (reacting and inert gasses) introduced into the chamber.

Figure 2:
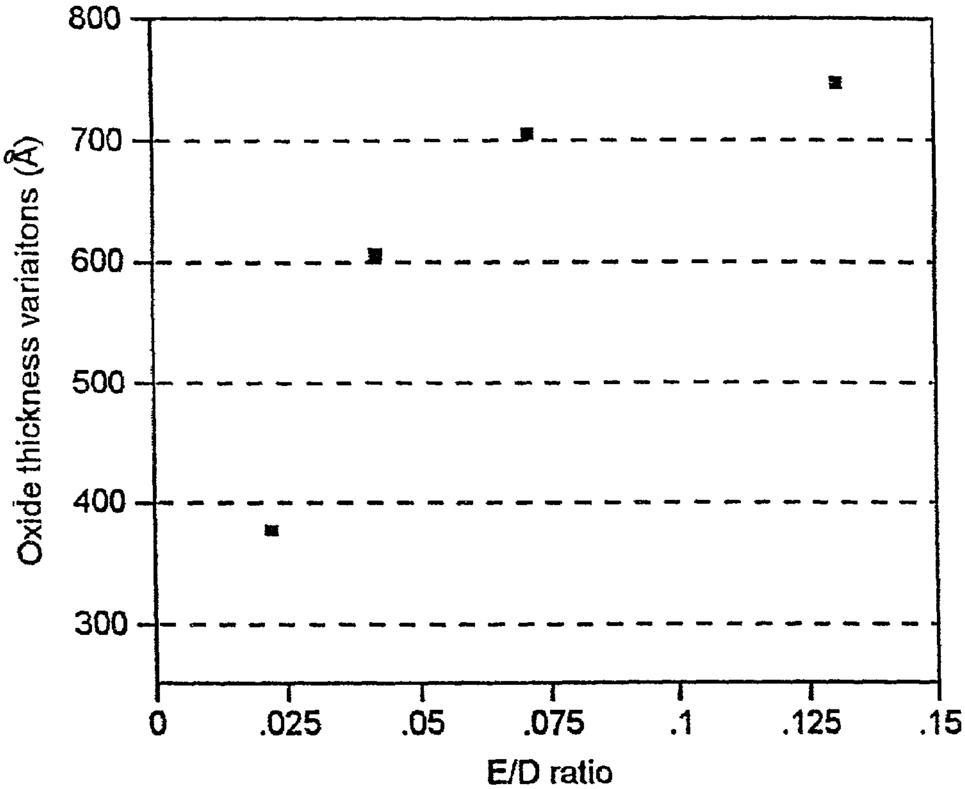
FIG. 2 is a graph plotting fill layer thickness variations versus etch to deposition ratio.

FIG. 2 is a graph showing a relationship (plotted as squares) between E/D ratio and oxide thickness variation in a layer filling an approximately 1800 Å wide trench and an approximately 8800 Å wide trench. Both trenches are about 5000 Å deep. As shown in FIG. 2, the inventors have discovered that the fill layer thickness variation between narrow and wide trenches begins to markedly decrease at an E/D ratio less than about 0.075. A thickness variation less than 390 Å is achieved using an E/D ratio of about 0.022.

Figure 3:
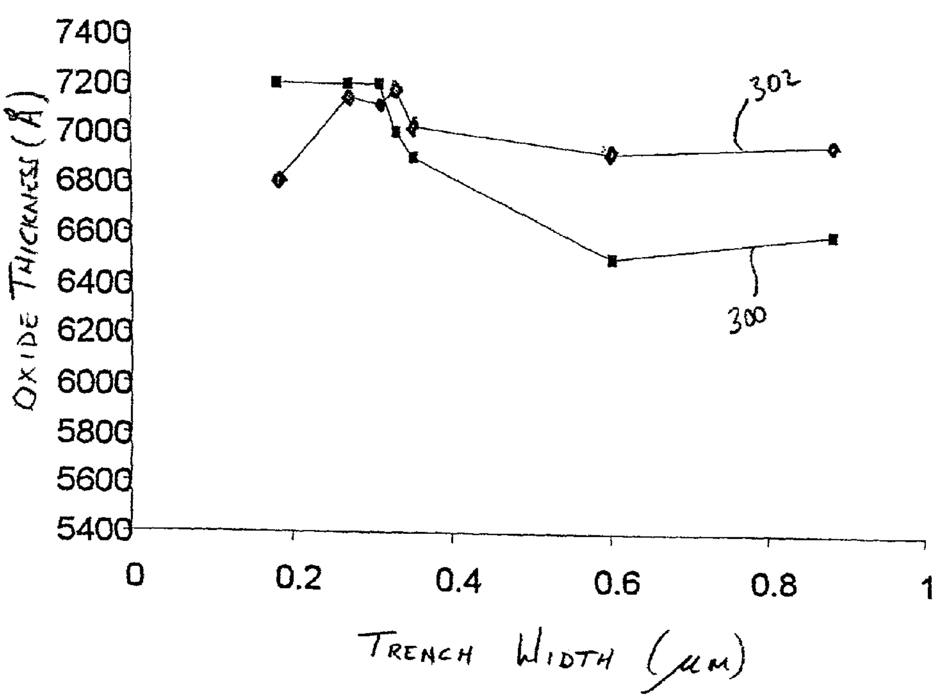
FIG. 3 is a graph plotting fill layer thickness versus trench width.

FIG. 3 is a graph showing relationships between trench widths and fill layer thicknesses. The trench widths are plotted in the range of 0.0–1.0 micrometers (μm) along the horizontal axis and the fill layer thickness are plotted in angstroms along the vertical axis. Curve 300 (shown defined by the squares) is a plot showing thicknesses of an $SiO_2$ layer deposited in substrate trenches of various widths using an HDP-CVD process with an E/D ratio of about 0.07. Referring to FIGS. 1 and 3 together in one illustrative case, in which trench 10 is approximately 1800 Å wide and trench 12 is approximately 8800 Å wide, the oxide thickness difference is approximately 600 Å. In cases with other large trench width variations, as illustrated by FIG. 3, the typical thickness difference between narrow and wide trenches is approximately 700–900 Å.

Curve 302 (shown defined by the plotted diamonds) is a plot showing $SiO_2$ thicknesses when deposited using an HDP-CVD process having a reduced E/D ratio of about 0.022. It can be seen that for various trench widths, the thickness differences are less than 400 Å—significantly less than for the 0.07 E/D ratio process used to define curve 300. In the case of 1800 Å and 8800 Å wide trenches, the thickness variation is about 200 Å.

Figure 4:
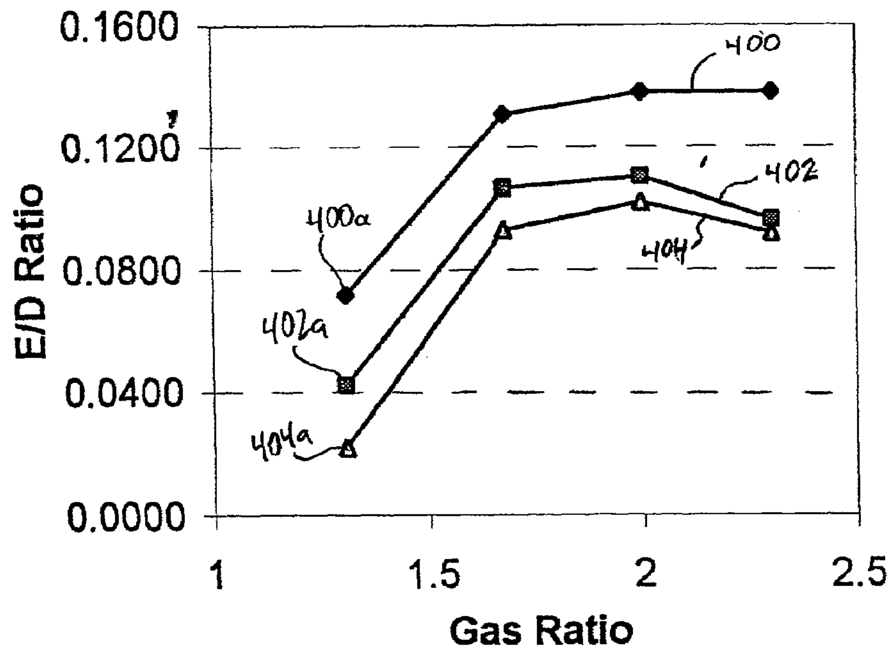
FIG. 4 is a graph plotting etch to deposition ratio versus silane to oxygen gas ratio.

The inventors have further discovered that a low $O_2$:$SiH_4$ ratio and a low power high frequency bias signal will achieve a desirable low E/D ratio in the HDP-CVD process. Reducing the total gas flow rate also helps to achieve the desirable low E/D ratio. FIG. 4 is a graph showing three relationships between an $O_2$:$SiH_4$ gas ratio plotted along the horizontal axis and an E/D ratio plotted along the vertical axis. The upper curve 400 (shown defined by the diamonds) is for an HDP-CVD process using a 2000 watt (W) power HF bias signal and 325 standard cubic centimeter per minute (SCCM) helium (He) gas flow rate. In this instance, He is used because $He^+$ions are more effective than, e.g., $Ar^+$ions to sputter etch the oxide deposited at the upper trench corners that helps to fill the trenches. However, other ions such as $Ar^+$may be used in other instances. The middle curve 402 (shown defined by the squares) is for a 1500 W power HF bias signal and 325 SCCM He gas flow rate. The lower curve 404 (shown defined by the triangles) is for a 1500 W power HF bias signal and 200 SCCM He gas flow rate. For the conditions shown in FIG. 4, a chamber pressure of less than 6.3 millitorr is maintained during processing in the SPEED tool.

As shown in FIG. 4, for various HF bias signal power levels and various total gas flow rates, the E/D ratio begins to be reduced at an $O_2$:$SiH_4$ ratio of approximately 1.7, and is significantly reduced at an $O_2$:$SiH_4$ ratio of approximately 1.3. In some cases, illustrated by points **400*a*,402*a*,404*a*, this 1.3 gas ratio is achieved using an $O_2$ flow rate of approximately 170 SCCM and an $SiH_4$ flow rate of approximately 130 SCCM. The flow rates for other $O_2$:$SiH_4$ ratios are shown in TABLE I. It is also seen by comparing curves 400 and 402 that lowering the HF bias signal power lowers the E/D ratio when gas flow rates remain constant. By comparing curves 402 and 404** it is seen that lowering total gas flow rate reduces the E/D ratio when bias signal power and oxygen and silane rates remain constant.

TABLE I

| $O_2$:$SiH_4$ Ratio | $SiH_4$ (SCCM) | $O_2$ (SCCM) |
|---|---|---|
| 1.67 | 140 | 235 |
| 2.0 | 150 | 300 |
| 2.3 | 130 | 300 |

Referring again to FIG. 1, embodiments of the invention result in the difference between the layer 20 thickness over surface 22 and the layer 20 thickness over surface 26 is less than when using known HDP-CVD processes. Following deposition, in one embodiment layer 20 is polished using conventional CMP to expose the top surface of silicon nitride layer 18. Such CMP results in surface 32 over trench 10 and surface 34 over trench 12. Layer 20 is further etched using a conventional hydrofluoric acid etch to produce surface 36 over trench 10 and surface 38 over trench 12. In one case surfaces 36,38 are approximately 600 Å below top surface 40 of polycrystalline silicon layer 16.

Skilled artisans will appreciate that the specific embodiments disclosed herein are illustrative, and that many variations are possible. Embodiments are not confined to depositing silicon dioxide or silicon substrates. For example, embodiments may include an HDP-CVD process for phosphate silica glass (PSG), which may be used as the pre-metal layer dielectric. Embodiments may also be used for inter-metal dielectric layer processes. Therefore, the scope of patent protection sought is defined by the claims appended hereto.

We claim:

1. A method of depositing silicon dioxide into trenches defined in a semiconductor substrate, where at least two of the trenches are of different aspect ratios, said depositing method comprising:

(a) using oxygen and silane gases to reactively form silicon dioxide for deposition into said different trenches of the substrate;

(b) using ions to sputter etch a portion of the formed silicon dioxide during the deposition so as to fill the trenches with the formed silicon dioxide without creating voids of substantial size during said filling of said different trenches; and (c) controlling the etch and the deposition of the silicon dioxide such that a nonzero etch to deposition ratio of 0.025 or less is established during the filling of said different trenches.

2. The method of claim 1 further comprising using an oxygen to silane ratio of 1.3 or less.

3. The method of claim 1 further comprising using a total gas flow of the oxygen, the silane, and an inert gas of 625 standard cubic centimeters per minute or less.

4. The method of claim 1 further comprising using a total gas flow of the oxygen, the silane, and an inert gas of 500 standard cubic centimeters per minute or less.

5. The method of claim 1 further comprising using a high frequency bias signal power of 2000 watts or less.

6. The method of claim 1 further comprising using a high frequency bias signal power of 1500 watts or less.

7. The method of claim 1 further comprising the act of doping the silicon dioxide during deposition.

8. The method of claim 1 further comprising the act of depositing the silicon dioxide over an electrically conductive layer used as an interconnect.

9. The method of claim 8, wherein the electrically conductive layer is metal.

10. The depositing method of claim 1 wherein a first of said trenches is at least twice as wide as a second of said trenches.

11. The depositing method of claim 1 wherein a first of said trenches has a width in the range of about 1800 Å to 3300 Å and a second of said trenches has a width in the range of about 6600 Å to 8800 Å.

12. The method of claim 1 wherein the used ions include helium.

13. A method of depositing silicon dioxide over a semiconductor substrate, comprising:

using oxygen and silane gases to deposit silicon dioxide over the substrate;

using ions to etch a portion of the deposited silicon dioxide during the deposition;

controlling the etch and the deposition of the silicon dioxide such that an etch to deposition ratio is 0.07 or less depositing the silicon dioxide over a layer of silicon nitride, the silicon nitride being formed over a layer of polycrystalline silicon;

polishing the silicon dioxide to expose a top surface of the silicon nitride; and etching the silicon dioxide such that a top surface of the etched silicon dioxide is below a top surface of the layer of polycrystalline silicon.

14. An integrated circuit structure comprising silicon dioxide filling at least two trenches of differing widths, where the trench-filling silicon dioxide of said at least two trenches is the product of a method comprising:

(a) using oxygen and silane gases to reactively form the silicon dioxide;

(b) using ions to etch a portion of the formed silicon dioxide; and (c) controlling the etch and the deposition of the silicon dioxide such that a nonzero etch to deposition ratio of 0.025 or less is established during the filling of said at least two trenches of differing widths, where said filling does not create voids of substantial size in said two trenches of differing widths.

15. The integrated circuit of claim 14, wherein using oxygen and silane gases comprises using an oxygen to silane ratio of 1.3 or less.

16. The integrated circuit of claim 14, wherein using oxygen and silane gasses comprises using a total gas flow rate of the oxygen, the silane, and an inert gas, the total gas flow rate being 625 standard cubic centimeters per minute or less.

17. The integrated circuit of claim 14, wherein using oxygen and silane gasses comprises using a total gas flow rate of the oxygen, the silane, and an inert gas, the total gas flow rate being 500 standard cubic centimeters per minute or less.

18. The integrated circuit of claim 14, wherein the ions used during deposition of the silicon dioxide are subjected to a high frequency bias signal power of 2000 watts or less.

19. The integrated circuit of claim 14, wherein the ions used during deposition of the silicon dioxide are subjected to a high frequency bias signal power of 1500 watts or less.

20. A method of depositing silicon dioxide into trenches defined in a semiconductor substrate, where at least two of the trenches are of different aspect ratios, said depositing method comprising:

(a) using silane gas, oxygen gas, and an inert gas to reactively form, deposit, and resputter the silicon dioxide, wherein a ratio of oxygen inflow rate to silane inflow rate is 1.7 or less, and wherein the total flow rate of the silane, oxygen, and inert gasses is 500 standard cubic centimeters per minute or more; and (b) controlling a bias signal which affects a sputter etch action of the inert gas to thereby establish an etch-to-deposition ratio for the formed silicon dioxide which is less than 0.075.

21. The method of claim 20, wherein the ratio of oxygen to silane inflow rates is 1.3 or less.

22. The method of claim 20, wherein the bias signal is controlled to have a power of 2000 watts or less.

23. The method of claim 20, wherein the bias signal is controlled to have a power of 1500 watts or less.

24. The method of claim 20, wherein a total flow rate of the silane, oxygen, and inert gasses is 625 standard cubic centimeters per minute or less.

25. An integrated circuit structure comprising silicon dioxide formed in plural trenches where at least a first trench is at least twice as wide a second of the trenches, the silicon dioxide having been deposited by a deposition method comprising:

(a) using silane gas, oxygen gas, and an inert gas to reactively form, deposit, and resputter the silicon dioxide, wherein a ratio of oxygen inflow rate to silane inflow rate is 1.7 or less, and wherein the total flow rate of the silane, oxygen, and inert gasses is 500 standard cubic centimeters per minute or more; and (b) controlling a bias signal which affects a sputter etch action of the inert gas to thereby establish an etch-to-deposition ratio for the formed silicon dioxide which is less than 0.075.

26. The integrated circuit of claim 25, wherein the ratio of oxygen to silane inflow rates is 1.3 or less.

27. The integrated circuit of claim 25, wherein the signal has a power of 2000 watts or less.

28. The integrated circuit of claim 25, wherein the signal has a power of 1500 watts or less.

29. The integrated circuit of claim 25, wherein a total flow rate of the silane, oxygen, and inert gasses is 625 standard cubic centimeters per minute or less.

30. A method of depositing silicon dioxide into trenches defined in a semiconductor substrate, where at least two of the trenches are of different aspect ratios, said depositing method comprising:

(a) using silane gas, oxygen gas, and helium gas to reactively form, deposit, and resputter the silicon dioxide, wherein a ratio of oxygen inflow rate to silane inflow rate is 1.7 or less; and (b) controlling a bias signal which affects a sputter etch action of the helium gas to thereby establish an etch-to-deposition ratio for the formed silicon dioxide which is less than 0.075.

31. The method of claim 30, wherein the ratio of oxygen to silane inflow rates is 1.3 or less.

32. The method of claim 30, wherein the signal has a power of 2000 watts or less.

33. The method of claim 30, wherein the signal has a power of 1500 watts or less.

34. The method of claim 30, wherein a total flow rate of the silane, oxygen, and helium gasses is 625 standard cubic centimeters per minute or less.

35. The method of claim 30, wherein the total flow rate is 500 standard cubic centimeters per minute or less.

36. An integrated circuit structure comprising silicon dioxide formed in plural trenches where at least a first trench is at least twice as wide a second of the trenches, the silicon dioxide having been deposited by a deposition method comprising:

(a) using silane gas, oxygen gas, and a helium gas to reactively form, deposit, and resputter the silicon dioxide, wherein a ratio of oxygen inflow rate to silane inflow rate is 1.7 or less; and (b) controlling a bias signal which affects a sputter etch action of the helium gas to thereby establish an etch-to-deposition ratio for the formed silicon dioxide which is less than 0.075.

37. The method of claim 36, wherein the ratio of oxygen to silane inflow rates is 1.3 or less.

38. The method of claim 36, wherein the signal has a power of 2000 watts or less.

39. The method of claim 36, wherein the signal has a power of 1500 watts or less.

40. The method of claim 36, wherein a total flow rate of the silane, oxygen, and helium gasses is 625 standard cubic centimeters per minute or less.

41. The method of claim 36, wherein the total flow rate of the silane, oxygen, and helium gasses is 500 standard cubic centimeters per minute or less.

42. A method of depositing silicon dioxide into trenches defined in a semiconductor substrate, where at least two of the trenches are of different aspect ratios, said depositing method comprising:

(a) using oxygen and silane gases to reactively form silicon dioxide for deposition into said different trenches of the substrate;

(b) using ions to sputter etch a portion of the formed silicon dioxide during the deposition so as to fill the trenches with the formed silicon dioxide without creating voids of substantial size during said filling of said different trenches;

(c) controlling the etch and the deposition of the silicon dioxide such that a nonzero etch to deposition ratio of about 0.07 or less is established during the filling of said different trenches;

(d) overfilling said at least two of the trenches with the deposited silicon dioxide; and (e) using chemical mechanical polishing (CMP) to remove at least a portion of the overfilling silicon dioxide.

43. The method of claim 42 and further wherein said at least two of the trenches have silicon nitride at top portions thereof and said CMP removal stops at the silicon nitride top portions of said at least two trenches.

44. A method of using high-density plasma chemical-vapor deposition (HDP-CVD) to deposit silicon oxide on a semiconductor-containing substrate having trenches defined therein, where the trenches include those of different aspect ratios, at least one trench having a relatively high depth-to-width aspect ratio equal to or greater than 2.5 and at least a second trench having a depth-to-width aspect ratio which is comparatively smaller, said HDP-CVD method comprising:

(a) applying one or more electromagnetic fields to an ionized plasma containing oxygen, silane, and an inert gas where the oxygen and silane of the plasma can reactively combine to form first silicon oxide for deposition on the semiconductor-containing substrate; and (b) controlling at least one of:

(b.1) the oxygen-to-silane ratio in the plasma, (b.2) a first of the electromagnetic fields, and (b.3) total input gas flow for supplying said oxygen, silane, and inert gas to said plasma, to thereby establish a nonzero etch-to-deposition ratio (E/D ratio) condition of about 0.07 or less where said E/D ratio can be defined as a difference in thickness of net deposited silicon oxide with said first electromagnetic field turned on and off divided by the thickness of net deposited silicon oxide with said first electromagnetic field turned off.

45. The HDP-CVD method of claim 44 wherein the ionized plasma further contains a sputter etch agent which can sputter etch at least a portion of the deposited first silicon oxide; and (b.3a) the total gas inflow of the oxygen, silane and the sputter etch agent is about 625 standard cubic centimeters per minute (sccm) or less.

46. The HDP-CVD method of claim 44 wherein the first silicon oxide includes silicon dioxide.

47. The HDP-CVD method of claim 44 wherein the first silicon oxide includes phospahate silica glass.

48. The HDP-CVD method of claim 44 wherein the comparatively smaller aspect ratio of the second trench less than about 1.

49. The HDP-CVD method of claim 48 wherein the first trench has a width in the range of about 1800 Å to 3300 Å.

50. The HDP-CVD method of claim 44 wherein the inert gas includes helium.

51. A monolithically integrated device having a semiconductor-containing substrate and plural trenches defined to extend into at least one layer of the device to substantially same depths, where at least a first and second of said same-depth trenches respectively have different widths, the width of the second trench being at least twice the width of the first trench, said integrated device being further characterized by:

(a) said same depth trenches of different widths are each filled with a silicon oxide deposited by way of high-density plasma chemical-vapor deposition (HDP-CVD) to substantially same heights above said substantially same depths to thereby provide a substantially planar set oxide-filled trenches upon which other layers of material are founded where said oxide-filled trenches do not have voids of substantial size defined therein;

(b) the heights of said oxide-filled trenches lie adjacent to silicon regions; and (b. 1) the heights of said oxide-filled trenches are defined at least by chemical mechanical polishing (CMP).

52. The integrated device of claim 51 wherein:

(b.2) the heights of said oxide-filled trenches are further defined by an acid etch carried out after said chemical mechanical polishing (CMP).

53. The integrated device of claim 52 wherein:

(b.3) the heights of said oxide-filled trenches, after said acid etch, are within about 600 Å of reference top surfaces of the adjacent to silicon regions.

* * * * *